(12) United States Patent
Cho

(10) Patent No.: US 7,227,811 B2
(45) Date of Patent: Jun. 5, 2007

(54) ADDRESS LATCH SIGNAL GENERATION CIRCUIT AND ADDRESS DECODING CIRCUIT

(75) Inventor: Yong Cho, Icheon-Shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 11 days.

(21) Appl. No.: 11/164,723

(22) Filed: Dec. 2, 2005

(65) Prior Publication Data

US 2006/0227623 A1  Oct. 12, 2006

(30) Foreign Application Priority Data

Apr. 1, 2005  (KR) ...................... 10-2005-0027748

(51) Int. Cl.
*G11C 8/18* (2006.01)

(52) U.S. Cl. ............................... 365/233.5; 365/230.08

(58) Field of Classification Search ............ 365/233.5, 365/230.08, 230.06
See application file for complete search history.

(56) References Cited

U.S. PATENT DOCUMENTS 5,305,283 A * 4/1994 Shimokura et al. .... 365/230.08
5,548,560 A * 8/1996 Stephens et al. ......... 365/233.5
6,711,648 B1 3/2004 Poechmueller et al.
6,747,909 B2 * 6/2004 Kang ..................... 365/230.06

FOREIGN PATENT DOCUMENTS

JP  2000-106532  4/2000
KR  10-1999-006349  1/1999

* cited by examiner

*Primary Examiner*—Anh Phung
(74) *Attorney, Agent, or Firm*—Marshall, Gerstein & Borun LLP (57) ABSTRACT

An address latch signal generation circuit and an address decoding circuit may generate an address latch signal capable of latching pre-decoded internal address signals. The circuits may include a plurality of address transition detectors, each of the address transition detectors receiving a plurality of internal address signals pre-decoded by a pre-decoder, detecting level transition states of the internal address signals, and generating a control signal which has a predetermined enable period; a first logic unit for performing a logic operation on the control signals received from the plurality of address transition detectors, and generating the result signal; and a latch signal output unit for performing synchronization with a disable time point of the result signal from the first logic unit, thereby generating the address latch signal.

22 Claims, 9 Drawing Sheets

FIG. 1

(PRIOR ART)

FIG. 2

(PRIOR ART)

FIG. 4

(PRIOR ART)

ADDRESS LATCH SIGNAL GENERATION CIRCUIT AND ADDRESS DECODING CIRCUIT

FIELD OF THE INVENTION

The present invention relates to an address latch signal generation circuit and an address decoding circuit using the same, and more particularly to an address latch signal generation circuit for generating an address latch signal to latch a pre-decoded internal column address signal, and an address decoding circuit using the same.

DESCRIPTION OF THE RELATED ART

In the case of an active cycle of a semiconductor device such as a synchronous DRAM, a word line is selected by a row address, and a bit line is selected by a column address. The semiconductor device reads data from a memory cell located at an intersection point between the selected word line and the selected bit line, or records data in the memory cell. The synchronous DRAM continuously performs data Input/Output (I/O) operations according to a burst scheme in many exemplary cases, such that it generates a column address using an address counter. Upon receiving a specific address for initiating read/write operations from an external part, the next internal address is generated by an address counter. The internal address generated by the address counter is primarily decoded by a pre-decoder, latched by a Y-address latch unit, and secondarily decoded by a final decoder, such that a column selection signal for selecting a column is generated.

A column selection signal generation path for use in a conventional semiconductor device will hereinafter be described with reference to FIG. 1.

Figure 1:
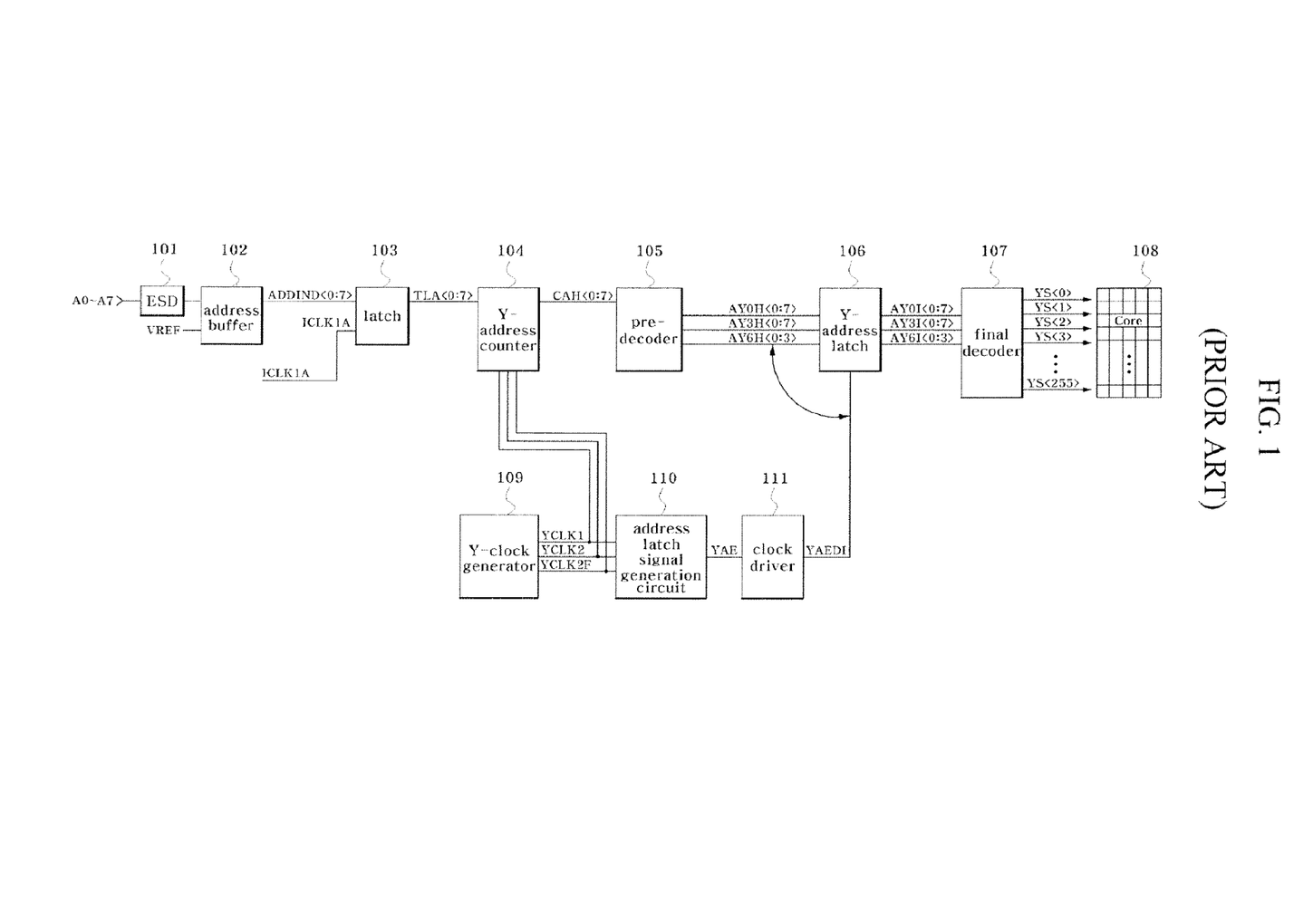
FIG. 1 is a block diagram illustrating a column address path of a conventional semiconductor device.

Referring to FIG. 1, external address signals A0~A7 received from an external part pass through an Electrostatic Discharge unit (ESD) 101, and are applied to an address buffer 102. The address buffer 102 compares a predetermined voltage with a reference voltage (VREF) to convert the external address signal into a digital signal ADDIND<0:7>, such that it finally outputs the digital signal ADDIND<0:7>. The latch unit 103 establishes synchronization with a predetermined internal clock ICLK1A received from an internal clock generation circuit (not shown), latches the digital signal ADDIND<0:7>, and outputs the latched output result TLA<0:7>. In this case, an address setup time and an address hold time are determined.

The Y-address counter 104 receives the latched output signal TLA<0:7> from the latch unit 103, and generates an internal column address CAH<0:7> during a burst operation such as a burst write operation or a burst read operation. In this case, the Y-address counter 104 establishes synchronization with Y-clock signals (YCLK1, YCLK2, and YCLK2F) generated from a Y-clock generator 109, and generates an internal column address. The Y-clock signal YCLK1 controls a seed address. The Y-clock signal YCLK2 controls a burst address, and the Y-clock signal YCLK2F controls a full-page address.

The pre-decoder 105 primarily decodes the internal column address CAH<0:7>, and outputs pre-decoded signals AY0H<0:7>, AY3H<0:7>, and AY6H<0:7>. In this case, the AY0H<0:7> signal is generated when internal column addresses CAH<0>~CAH<2> are pre-decoded. The AY3H<0:7> signal is generated when internal column addresses CAH<3>~CAH<5> are pre-decoded. The AY6H<0:3> signal is generated when internal column addresses CAH<6>~CAH<7> are pre-decoded.

The Y-address latch unit 106 latches the above-mentioned pre-decoded internal column addresses AY0H<0:7>, AY3H<0:7>AY6H<0:3> using a predetermined address latch signal YAEDI, such that it outputs signals AY0I<0:7>, AY3I<0:7>, and AY6I<0:3>. The final decoder 107 secondarily decodes the latched internal column address signals AY0I<0:7>, AY3I<0:7>, and AY6I<0:3>, and outputs column selection signals YS<0>~YS<255> for selecting a desired column.

The Y-address latch unit 106 establishes synchronization with the address latch signal YAEDI when latching the above-mentioned pre-recorded internal column address signals AY0H<0:7>, AY3H<0:7>, and AY6H<0:3>. The latch signal YAEDI is generated by the address latch signal generation circuit 110, is driven by a clock driver 111, and its generation process will hereinafter be described with reference to FIG. 2.

Figure 2:
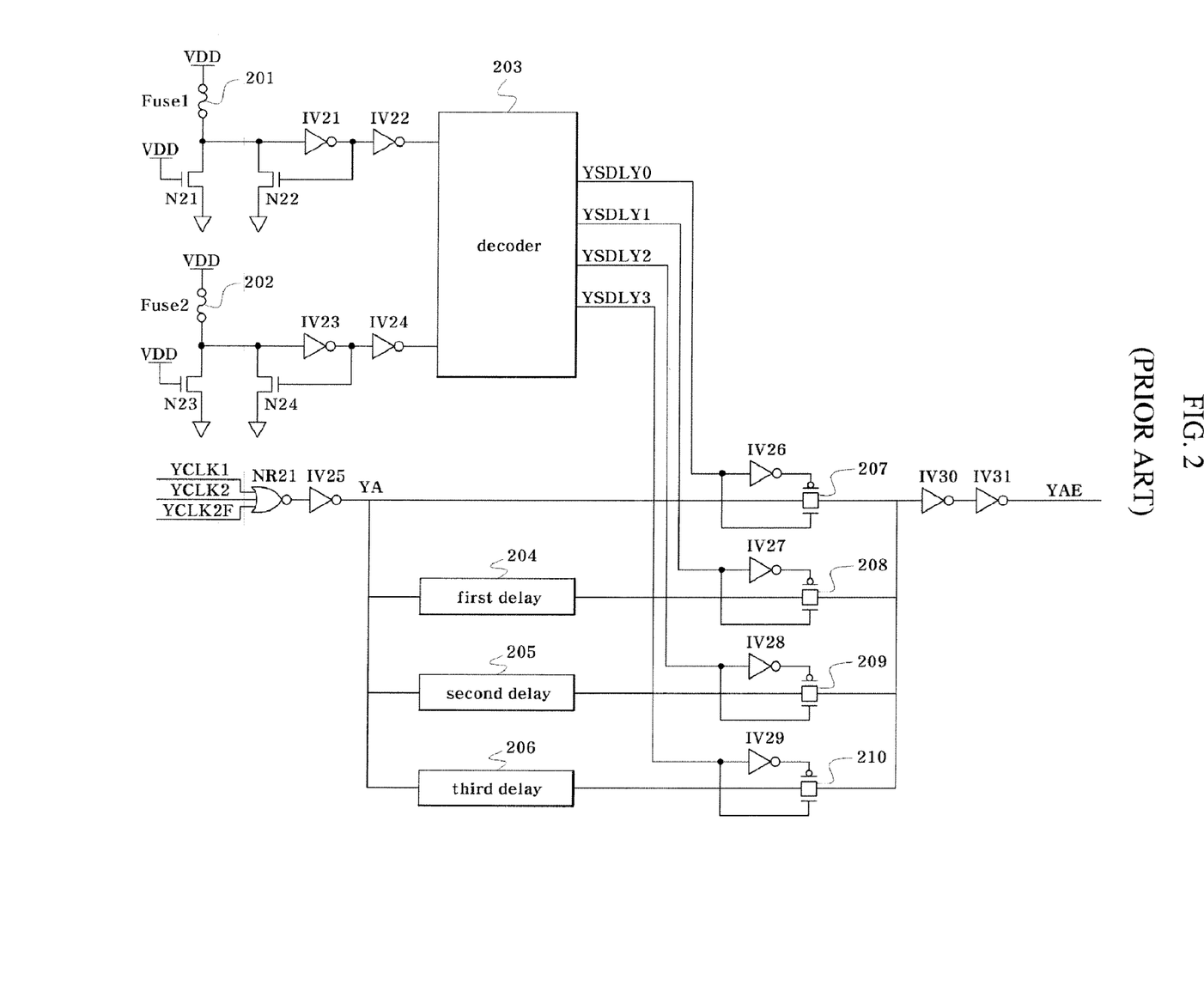
FIG. 2 is a detailed circuit diagram illustrating a conventional address latch signal generation circuit.

FIG. 2 is a detailed circuit diagram illustrating the address latch signal generation circuit 110. Referring to FIG. 2, the address latch signal generation circuit 110 generates an initial latch signal YAE using a logic-OR operation signal of Y-clocks (YCLK1, YCLK2, and YCLK2F) acting as a synchronous signal of the Y-address counter 104. In this case, an enable time point of the initial latch signal YAE is determined by control signals YSDLY0, YSDLY1, YSDLY02, and YSDLY3 whose levels are determined according to a connection or disconnection state of two fuses (Fuse1, Fuse2).

If the first fuse (Fuse1) and the second fuse (Fuse2) are not severed, only the control signal YSDLY0 is enabled at a high level by an operation of a decoder 203, and only a transmission gate 207 is turned on, such that a logic-OR operation signal (YA) of Y-clocks YCLK1, YCLK2, and YCLK2F is generated as an initial latch signal (YAE) without any change, Otherwise, if the first fuse (Fuse1) is severed and the second fuse is not severed, only the control signal YSDLY1 is enabled at a high level by an operation of the decoder 203, and only the transmission gate 208 is turned on. In this case, the YA signal is delayed by a first delay 204, and is generated as an initial latch signal YAE. Likewise, if the first fuse (Fuse1) is not severed and the second fuse (Fuse2) is severed, only the control signal YSDLY2 is enabled at a high level, the YA signal is delayed by a second delay 205, and is then generated as an initial latch signal YAE. Finally, if the first fuse Fuse1 and the second fuse Fuse2 are all severed, only the control signal YSDLY3 is enabled at a high level, the YA signal is delayed by the third delay 206, and is then generated as an initial latch signal YAE.

In order to allow the Y-address latch unit 106 to normally latch internal column address signals AY0H<0:7>, AY3H<0:7>, and AY6H<0:3>, an enable time point of the latch signal YAEDI must be properly adjusted. In other words, as shown in a reference number "303" in FIG. 3, if the internal column address signals AY0H<0:7>, AY3H<0:7>, and AY6H<0:3> are firstly level-transitioned, and then the latch signal YAEDI is enabled with a sufficient timing margin, the Y-address latch unit 106 can perform a normal latch operation. However, as shown in a reference number "304" in FIG. 3, if the latch signal YAEDI is enabled without guaranteeing a sufficient timing margin associated with level-transition time points of the internal column address signals AY0H<0:7>, AY3H<0:7>, and AY6H<0:3> applied to the Y-address latch unit 106, the Y-address latch 106 cannot perform a normal latch operation, resulting in the occurrence of I/O associated errors such as the selection of two-cells, etc.

Figure 3:
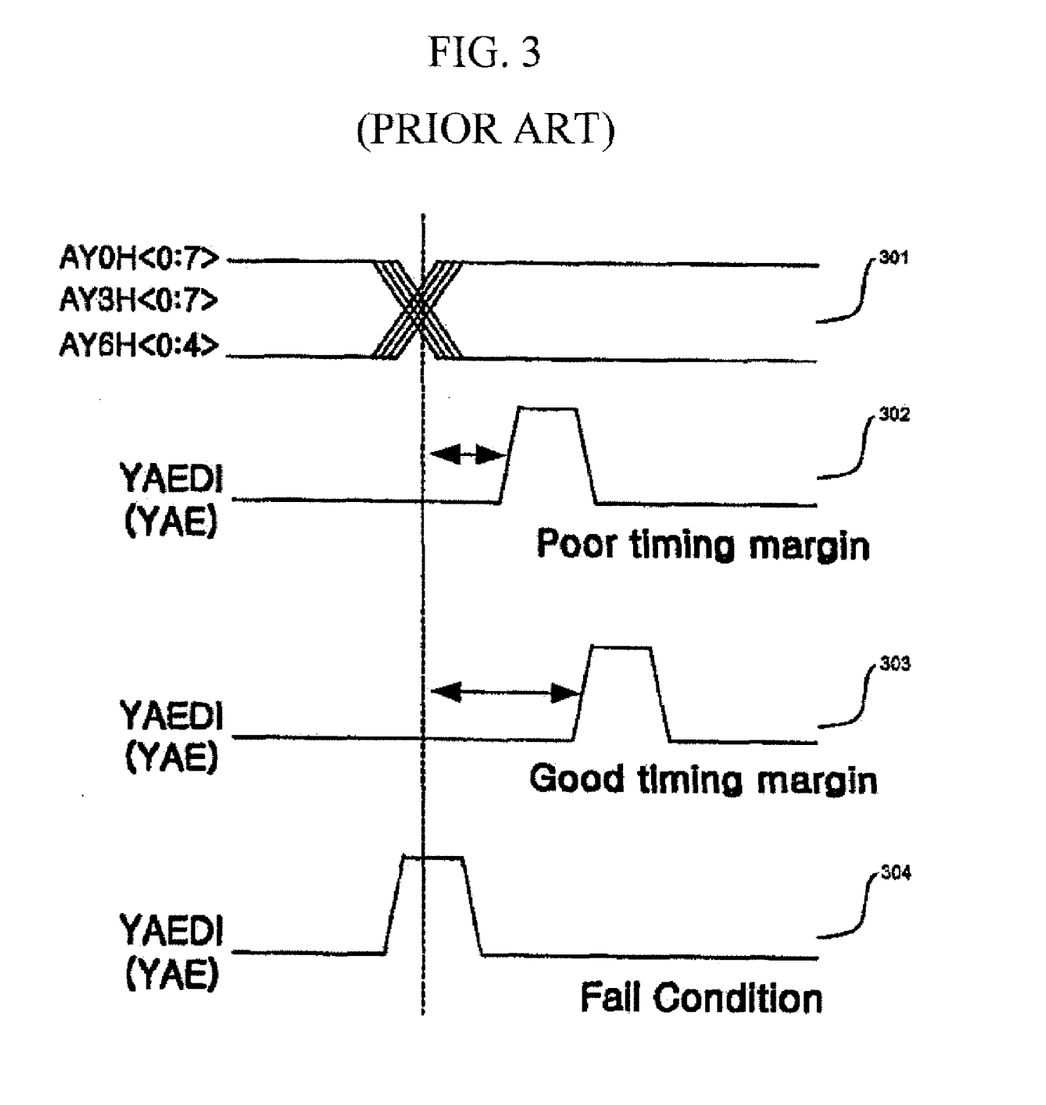
FIG. 3 is a timing diagram illustrating a timing relationship among address latch signals and internal column address signals according to the conventional art.
Figure 4:
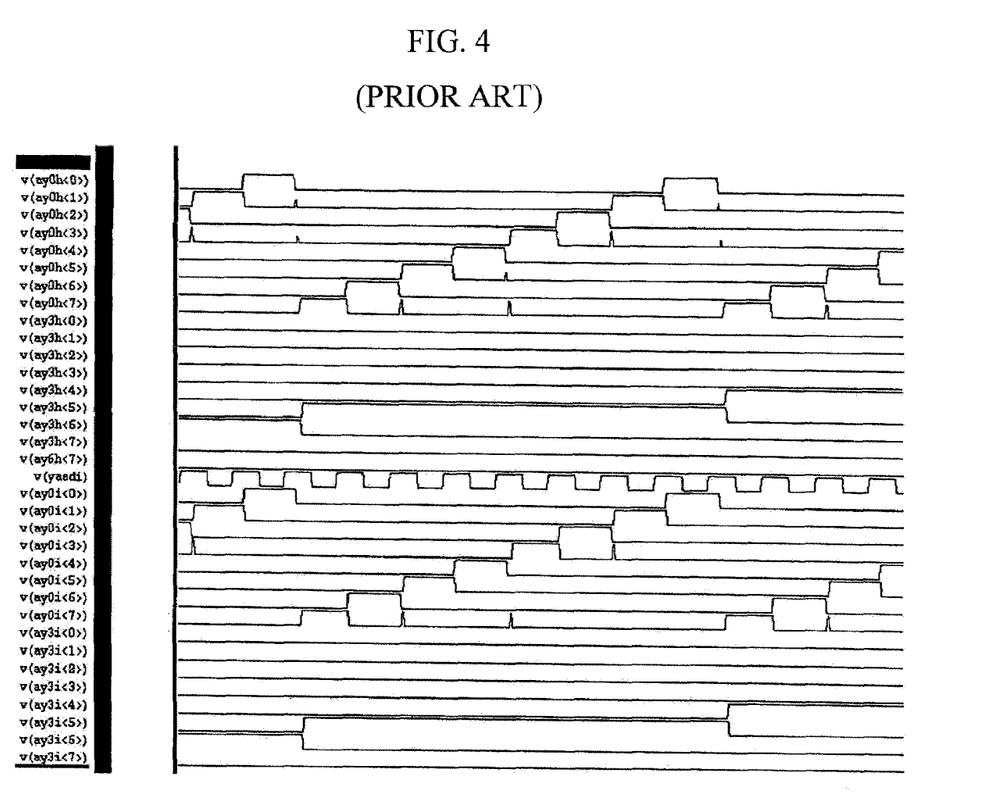
FIG. 4 is a waveform diagram illustrating internal column address signals latched by a conventional address latch signal.

FIG. 4 is a waveform diagram illustrating an example of erroneous operations generated under the above-mentioned case as denoted by a reference number 304 in FIG. 3. Referring to FIG. 4, if a signal line CAH<0:7> of FIG. 1 generates a skew due to a crosstalk or coupling effect, a glitch occurs in the internal column address signals AY0H<0:7>, AY3H<0:7>, and AY6H<0:3> acting as output signals of the pre-decoder 105. In this case, if the time margin is sufficiently guaranteed as shown in 302 or 304 of FIG. 3, the glitch is not removed, and two column selection signals are finally generated, such that there arises an unexpected error in which two cells are simultaneously selected from a memory core. For reference, the above-mentioned glitch does not indicate a normal clock signal, and indicates noise generated by a switching operation of a digital circuit.

As described above, if the sufficient timing margin is not guaranteed, the conventional semiconductor device controls an enable time point of the latch signal YAEDI by controlling a connection or disconnection state of the fuses Fuse1 and Fuse2, resulting in an increased timing margin. The above-mentioned conventional method for controlling the enable time point of the address latch signal YAEDI using fuses can be executed in a wafer stage, and the fuses cannot be severed in a package stage, such that the above-mentioned conventional method is not applicable to a timing adjusting process. Furthermore, although a semiconductor successfully passes a memory test process, it may unexpectedly generate an error in a mounting application stage, such that the above-mentioned conventional method is useless in the above-mentioned case.

SUMMARY OF THE INVENTION

An address latch signal generation circuit and an address decoding circuit using the same may determine whether an internal column address signal is level-transitioned when generating an address latch signal for latching a pre-decoded internal column address signal, generate an address latch signal having a predetermined timing margin associated with the level-transition time point, prevent a skew or glitch from being generated by an insufficient timing margin between a level-transition interval of the internal column address signal and an address latch signal, and prevent I/O-associated erroneous operations from being generated by the skew or glitch.

In accordance with one of the herein described embodiments, an address latch signal generation circuit for generating an address latch signal capable of latching pre-decoded internal address signals, may include a plurality of address transition detectors, each of the address transition detectors receiving a plurality of internal address signals pre-decoded by a pre-decoder, detecting level transition states of the internal address signals, and generating a control signal which has a predetermined enable period; a first logic unit for performing a logic operation on the control signals received from the plurality of address transition detectors, and generating the result signal; and a latch signal output unit for performing synchronization with a disable time point of the result signal from the first logic unit, thereby generating the address latch signal.

In accordance with another of the herein described embodiments, an address decoding circuit may include an address latch signal generation circuit for generating an address latch signal capable of latching a plurality of internal address signals pre-decoded by a pre-decoder; an address latch unit for performing synchronization with the address latch signal, latching the pre-decoded internal address signals, and generating the latched result signals; and a final decoder for decoding the internal address signals latched by the address latch unit, and generating a column selection signal.

The address latch signal generation circuit may include a plurality of address transition detectors, each of the address transition detectors receiving a plurality of internal address signals pre-decoded by the pre-decoder, detecting level transition states of the internal address signals, and generating a control signal which has a predetermined enable period; a first logic unit for performing a logic operation on the control signals received from the plurality of address transition detectors, and generating the result signal; and a latch signal output unit for performing synchronization with a disable time point of the result signal from the first logic unit, thereby generating the address latch signal.

Each of the address transition detectors may include a plurality of detection signal output units, each of which receives one of the internal address signals, detects a level transition state of the received internal address signal, and generates a transition detection signal having a predetermined enable period; and a second logic unit for performing a logic operation on the transition detection signals received from the detection signal output units, and generating the logic operation result.

Each of the detection signal output units may include a first delay for delaying the received internal address signal by a predetermined time; and a third logic unit for performing a logic operation on the received internal address signal and the delayed result signal received from the first delay.

The third logic unit may perform an exclusive-OR operation.

The third logic unit may include a first inverter for inverting the output signal of the first delay; a fourth logic unit for performing a logic-AND operation between the received internal address signal and the output signal of the first inverter; a second inverter for inverting the received internal address signal; a fifth logic unit for performing a logic-AND operation between the output signal of the first delay and the output signal of the second inverter; and a sixth logic unit for performing a logic-OR operation on the output signals of the fourth and fifth logic units.

The second logic unit may perform a logic-OR operation on output signals of the detection signal output units.

The first logic unit may perform a logic-OR operation.

The latch signal output unit may include a second delay for delaying the output signal of the first logic unit by a predetermined time; a buffer for buffering the output signal of the second delay; and a seventh logic unit for performing a logic operation between the output signal of the first logic unit and the output signal of the buffer.

The buffer may be an inverter capable of performing an inversion-buffering operation.

The seventh logic unit may perform a NOR-operation.

The internal address signal may be a column address signal.

BRIEF DESCRIPTION OF THE DRAWINGS

Features and other advantages of the present invention will be more clearly understood from the following detailed description taken in conjunction with the accompanying drawings, in which.

DETAILED DESCRIPTION

Now, various embodiments of the present invention will be described with reference to the annexed drawings. In the drawings, the same or similar elements are denoted by the same reference numerals even though they are depicted in different drawings. In the following description, a detailed description of known functions and configurations is omitted.

Figure 5:
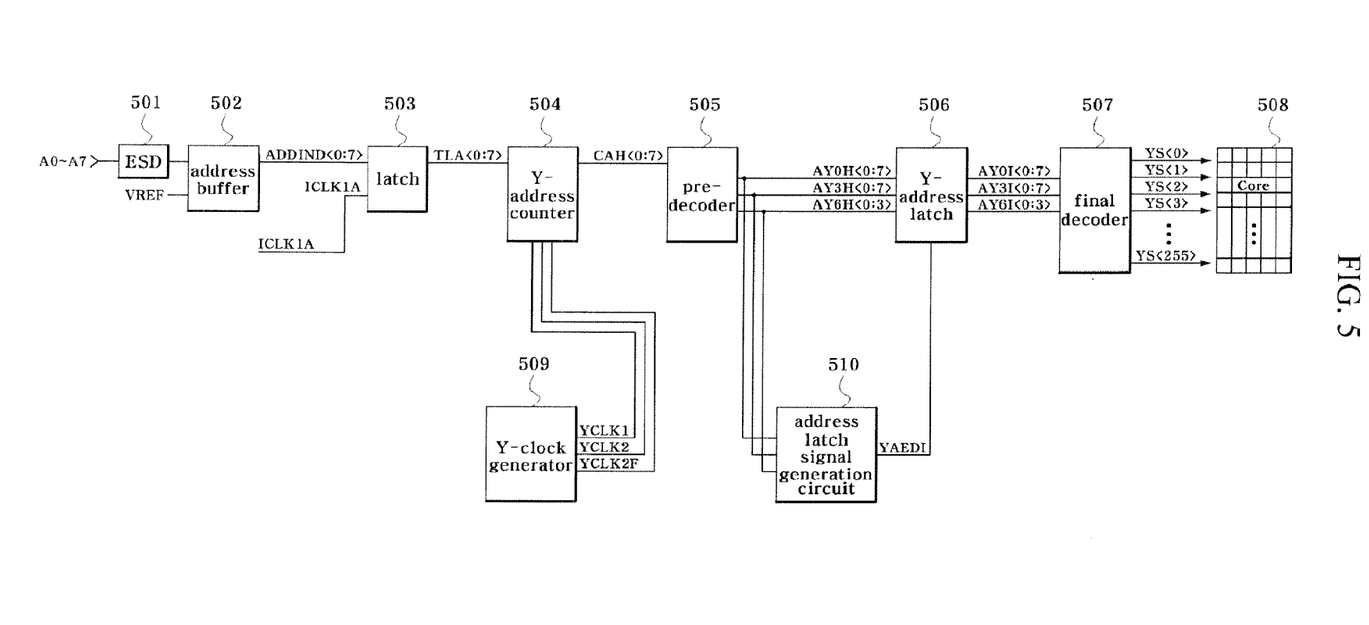
FIG. 5 is a block diagram illustrating a column address path of a semiconductor device according to one or more of the herein described embodiments.

FIG. 5 is a block diagram illustrating a column address path of a semiconductor device according to one or more of the herein described embodiments.

Figure 6:
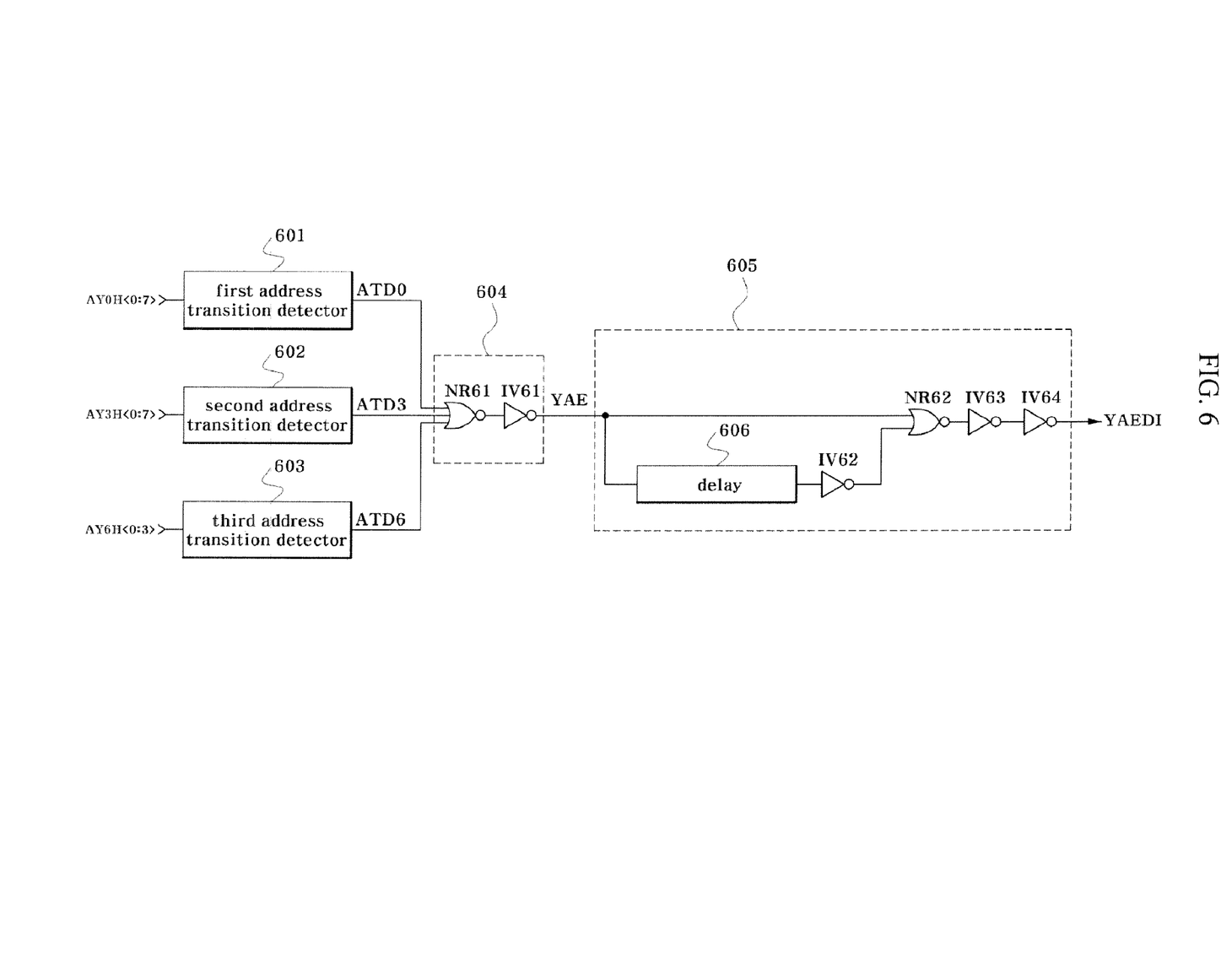
FIG. 6 is a block diagram illustrating an address latch signal generation circuit in accordance with one or more of the herein described embodiments.
Figure 7:
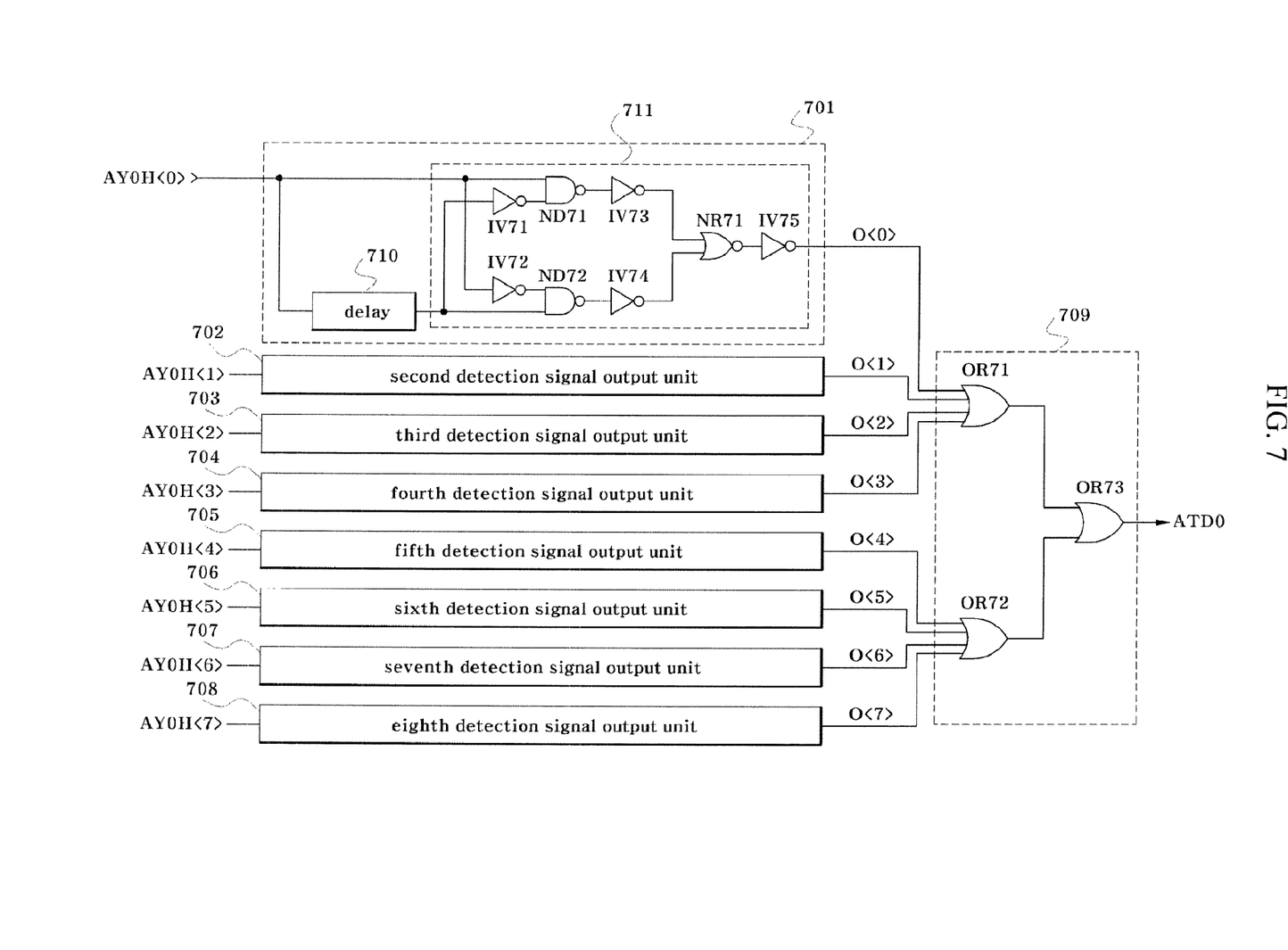
FIG. 7 is a circuit diagram illustrating an address transition detector for use in an address latch signal generation circuit in accordance with one or more of the herein described embodiments.

FIG. 6 is a block diagram illustrating an address latch signal generation circuit in accordance with one or more of the herein described embodiments. FIG. 7 is a circuit diagram illustrating an address transition detector for use in an address latch signal generation circuit in accordance with one or more of the herein described embodiments.

Referring to FIG. 5, the address latch signal generation circuit may include a plurality of address transition detectors 601~603, a first logic circuit 604, and a latch signal output unit 605. The address transition detectors 601~603 receive a plurality of internal column address signals AY0H<0:7>, AY3H<0:7>, and AY6H<0:3> pre-decoded by a pre-decoder 505, detect level-transition states of the internal column address signals AY0H<0:7>, AY3H<0:7>, and AY6H<0:3>, and output control signals ATD0, ATD3, and ATD6 having a predetermined enable period. The first logic unit 604 performs a logic-OR operation on the control signals ATD0, ATD3, and ATD6 received from the address transition detectors 601□603. The latch signal output unit 605 establishes synchronization with the signal YAE received from the first logic unit 604, and outputs the address latch signal YAEDI.

The address decoding circuit may include an address latch signal generation circuit 510, a Y-address latch unit 506, and the final decoder 507. The address latch signal generation circuit 510 latches the internal column address signals AY0H<0:7>, AY3H<0:7>, and AY6H<0:3> pre-decoded by the pre-decoder 505. The Y-address latch unit 506 establishes synchronization with the address latch signal YAEDI, latches the internal column address signals AY0H<0:7>, AY3H<0:7>, and AY6H<0:3>, and outputs the latched result. The final decoder 507 decodes the internal column address signals AY3I<0:7> and AY6I<0:3>, and outputs column selection signals YS<0>~YS<255>.

Each of the address transition detectors 601~603 may include a plurality of detection signal output units 701~708 and a second logic unit 709. The detection signal output units 701~708 receive one of the internal column address signals AYxH<0:7>, detect level transition states of the internal column address signals, and output a transition detection signal 0<x> having a predetermined enable period. The second logic unit 709 performs a logic-OR operation on output signals 0<0>~0<7> of the detection signal output units 701~708. In this case, each of the detection signal output units 701~708 may include a delay 701 for delaying an internal address signal by a predetermined time; and a third logic unit 710 for performing an exclusive-OR operation on both the internal address signal and the output signal of the delay 701, and outputting the logic operation result.

The latch signal output unit 605 may include a delay 606 for delaying an output signal of the first logic unit 604 by a predetermined time; an inverter IV62 for inverting the output signal of the delay 606, buffering the inverted signal, and outputting the buffering result; and a NOR gate NR62 for performing a NOR operation on both the output signal of the first logic unit 604 and the output signal of the inverter IN62, and outputting the logic operation result.

Operations of an exemplary address latch generation circuit and address decoding circuit will hereinafter be described with reference to FIGS. 5~9.

Referring to FIG. 5, external address signals A0~A7 received from an external part pass through an ESD 501, and are applied to an address buffer 502. The address buffer 502 compares a predetermined voltage with a reference voltage (VREF) to convert the external address signal into a digital signal ADDIND<0:7>, such that it finally outputs the digital signal ADDIND<0:7>. The latch unit 503 establishes synchronization with a predetermined internal clock ICLK1 A received from an internal clock generation circuit (not shown), latches the digital signal ADDIND<0:7>, and outputs the latched output result TLA<0:7>.

The Y-address counter 504 receives the latched output signal TLA<0:7> from the latch unit 503, and generates an internal column address CAH<0:7> during a burst operation such as a burst write operation or a burst read operation. In this case, the Y-address counter 504 establishes synchronization with Y-clock signals (YCLK1, YCLK2, and YCLK2F) generated from a Y-clock generator 509, and generates an internal column address. The Y-clock signal YCLK1 controls a seed address. The Y-clock signal YCLK2 controls a burst address, and the Y-clock signal YCLK2F controls a full-page address.

The pre-decoder 505 primarily decodes the internal column address CAH<0:7>, and outputs pre-decoded internal column address signals AY0H<0:7>, AY3H<0:7>, and AY6H<0:7>. In this case, the AY0H<0:7> signal is generated when internal column addresses CAH<0>~CAH<2> are pre-decoded. The AY3H<0:7> signal is generated when internal column addresses CAH<3>~CAH<5> are pre-decoded. The AY6H<0:3> signal is generated when internal column addresses CAH<6>~CAH<7> are pre-decoded.

The Y-address latch unit 506 latches the above-mentioned pre-decoded internal column addresses AY0H<0:7>, AY3H<0:7>AY6H<0:3> using a predetermined address latch signal YAEDI, such that it outputs signals AY0I<0:7>, AY3I<0:7>, and AY6I<0:3>. The final decoder 507 secondarily decodes the latched internal column address signals AY0I<0:7>, AY3I<0:7>, and AY6I<0:3>, and outputs column selection signals YS<0>~YS<255> for selecting a desired column.

The Y-address latch unit 506 establishes synchronization with the address latch signal YAEDI when latching the above-mentioned pre-recorded internal column address signals AY0H<0:7>, AY3H<0:7>, and AY6H<0:3>. The latch signal YAEDI is generated by the address latch signal generation circuit 510, and a process for generating the latch signal YAEDI will hereinafter be described with reference to FIG. 6.

FIG. 6 is a block diagram illustrating an exemplary address latch signal generation circuit 510. As shown in FIG. 2, the address latch signal generation circuit 510 generates an address latch signal YAEDI using pre-decoded internal column address signals AY0H<0:7>, AY3H<0:7>, AY6H<0:3> generated from the pre-decoder 505. In more detail, the internal column address signals AY0H<0:7>, AY3H<0:7>, and AY6H<0:3> are applied to a first address transition detector 601, a second address transition detector 602, and a third address transition detector 603, respectively.

Operations of the first address transition detector 601 will hereinafter be described with reference to FIG. 7. Referring to FIG. 7, the first address transition detector 601 detects level transition states of the internal column address signals AY0H<0>~AY0H<7>, and outputs a control signal ATD0 having a predetermined enable period. In other words, the first address transition detector 601 receives the internal column address signals AY0H<0>~AY0H<7> from first to eighth detection signal output units 701~708, respectively. In this case, the first to eighth detection signal output units 701~708 have the same structure, such that operations of the second to eighth detection signals can be easily predicted on the basis of operations of the first detection signal output unit 701.

The internal column address signal AY0H<0> applied to the first detection signal output unit 701 is delayed by a predetermined delay time by means of a delay 710, and the delayed result is generated from the delay 710. A third logic unit 711 receives the internal column address signal AY0H<0> and the signal delayed by the delay 710, performs an exclusive-OR operation on the received signals, and outputs the logic operation result. Generally, the exclusive-OR operation is indicative of a predetermined operation in which a high-level signal is generated when only one of two input signals enters a high-level state. Therefore, during a predetermined time in which the internal column address signal AY0H<0> continuously maintains a high-level or low-level state, only a high-level signal is applied to a third logic unit 711 or only a low-level signal is applied to the third logic unit 711, such that the output signal 0<0> of the third logic unit 711 enters a low-level state.

However, when the internal column address signal AY0H<0> is transitioned from a high-level state to a low-level state or is transitioned from a low-level state to a high-level state, an output signal of the delay 710 continuously maintains a previous level during the delay time, such that two signals applied to the third logic unit 711 have different levels. Therefore, an output signal 0<0> of the third logic unit 711 is transitioned to a high level during the above-mentioned delay time, and is then transitioned to a low level after the lapse of the above-mentioned delay time. In conclusion, the output signal of the third logic unit 711 is synchronized with level-transition of the internal column address signal Ay0H<0>, and is enabled at a high level during a predetermined period of time. In this manner, the output signals 0<1>~0<7> of the second to eighth detection signal output units 702~708 are synchronized with level transition of individual internal column address signals AY0H<1>~AY0H<7>, and are enabled at a high level during a predetermined period of time.

The second logic unit 709 including a first OR-gate OR71, a second OR-gate OR72, and a third OR-gate OR73 outputs an OR-operation result of the above-mentioned signals 0<0>~0<7>. The control signal ATD0 of the second logic unit 709 is enabled in a predetermined period whenever the internal column address signal AY0H<0:7> is level-transitioned, as shown in FIG. 8.

The second to third address transition detectors 602 and 603 have the same structure as the first address transition detector 601. Compared with the first and second address transition detectors 602 and 603, the third address transition detector 603 has 4 internal column address signals AY6H<0:3>, and the number of detection signal output units is 4. Compared with the first address transition detector 601, the second and third address transition detectors 602 and 603 detect a level-transition state of the internal column address signal, and output a control signal having a predetermined enable period.

Figure 8:
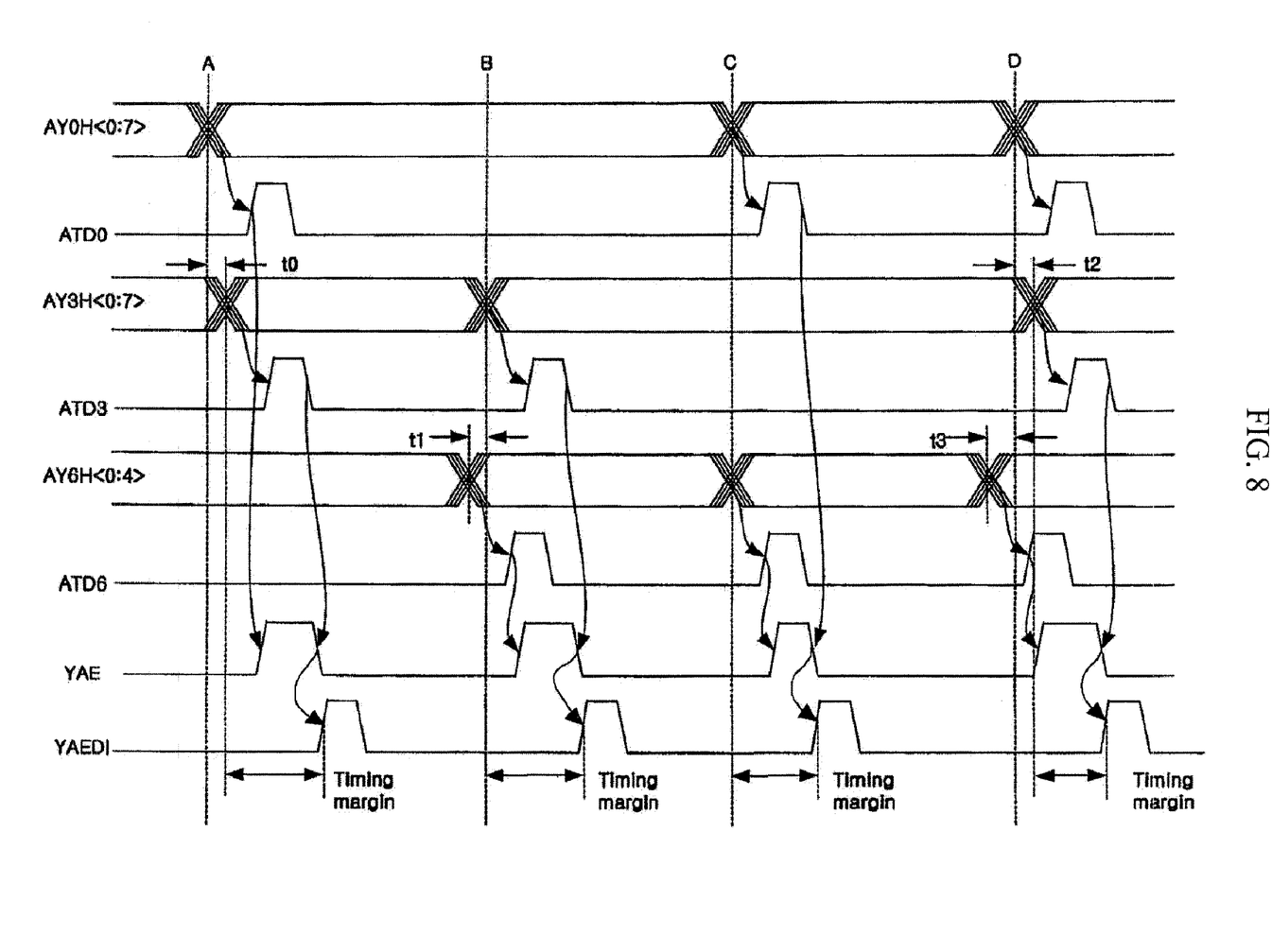
FIG. 8 is a timing diagram illustrating a timing relationship among address latch signals and internal column address signals according to one or more of the herein described embodiments.

As shown in FIG. 8, control signals ATD0, ATD3, and ATD6 generated from the first to third address transition detectors 601~603 are enabled during a predetermined period whenever individual internal column address signals AY0H<0:7>, AY3H<0:7> AY6H<0:3> are level-transitioned.

The third logic unit 711 shown in FIG. 7 shows an embodiment for performing an exclusive-OR operation, but the present invention is not limited to this example, and can be modified by those skilled in the art as necessary. The operation principle of the third logic unit 711 will hereinafter be described. During a predetermined time during which the internal column address signal Ay0H<0> continuously maintains a high-level or low-level state, output signals of NAND-gates ND71 and ND72 enter a high-level state, such that an output signal of a NOR-gate NR71 enters a high-level state, and an output signal 0<0> of the inverter IV75 enters a low-level state. Otherwise, when the internal column address signal AY0H<0> is transitioned from a high-level state to a low-level state, or is transitioned from a low-level state to a high-level state, the output signal of the delay 701 continuously maintains a previous level during the above-mentioned delay time. Therefore, one of the output signals of the NAND gates ND71 and ND72 enters a high-level state, and the other one enters a low-level state, such that the output signal of the NOR gate NR71 enters a low-level state and the output signal of the inverter IV75 enters a high-level state.

Referring back to FIG. 6, operations of the preferred embodiment according to the present invention will hereinafter be described. The control signals ATD0, ATD3, and ATD6 synchronized with level transition of the internal column address signals AY0H<0:7>, AY3H<0:7>, and AY6H<0:3> are applied to the first logic unit 604 for a logic-OR operation. Therefore, as shown in FIG. 8, the output signal YAE of the first logic unit 604 has a predetermined enable period corresponding to the sum of the enable period of the control signal ATD0, the enable period of the control signal ATD3, and the enable period of the control signal ATD6.

As shown in FIG. 6, the latch signal output unit 605 receives the YAE signal from the first logic unit 604, and outputs an address latch signal YAEDI, which is synchronized with a disable time point of the YAE signal and is then enabled. In more detail, if the YAE signal enters a low-level state, the NOR-gate NR62 receives a high-level signal from an inverter IV62, and outputs a low-level signal, such that the address latch signal YAEDI remains in a low-level state. Subsequently, if the YAE signal is transitioned from a low-level state to a high-level state, the NOR-gate NR62 receives a high-level signal via its one input terminal, and outputs a low-level signal, such that the address latch signal YAEDI continuously remains in a low-level state.

Thereafter, if the YAE signal is transitioned from a high-level state to a low-level state, a low-level signal is directly applied to one input terminal of the NOR-gate NR62. However, the inverter IV62 continuously receives the high-level signal indicative of a previous-level signal before a delay time of the delay 606 elapses, the other input terminal of the NOR-gate NR62 continuously receives a low-level signal from the inverter IV62. Therefore, the NOR-gate NR62 outputs a high-level signal before the above-mentioned delay time elapses, such that the address latch signal YAEDI enters a high-level state. Thereafter, if the above-mentioned delay time elapses, the inverter IV62 receives a low-level signal, and the NOR-gate NR62 receives a high-level signal from the inverter IV62 and outputs a low-level signal, such that the address latch signal YAEDI is transitioned to a low-level state.

In brief, the address latch signal YAEDI generated from the latch signal output unit 605 establishes synchronization at a specific time at which the YAE signal is disabled as a low-level state, such that it is enabled at a high-level state. The address latch signal YAEDI maintains the high-level state during the delay time caused by the delay 606, and is then disabled as a low-level state.

The Y-address latch unit 506 latches the pre-decoded internal column address signals AY0H<0:7>, AY3H<0:7>, and AY6H<0:3> using the address latch signal YAEDI, such that it outputs signals AY0I<0:7>, AY3I<0:7>, and AY6I<0:3>. The address latch signal generation circuit according to the present invention enables the address latch signal YAEDI while guaranteeing a sufficient timing margin associated with level-transition time points of the internal column address signals AY0H<0:7>, AY3H<0:7>, and AY6H<0:7>, such that it does not generate a skew or glitch caused by an insufficient timing margin, differently from the conventional art.

As shown in FIG. 8, the control signals ATD0, ATD3, and ATD6 indicative of detection signals synchronized/generated when the internal column address signals AY0H<0:7>, AY3H<0:7>, and AY6H<0:3> are level-transitioned are all disabled, and then the address latch signal YAEDI is enabled. Therefore, the address latch signal YAEDI may be generated only after the internal column address signals AY0H<0:7>, AY3H<0:7>, and AY6H<0:3> are level-transitioned. The Y-address latch unit 506 latches the internal column address signals AY0H<0:7>, AY3H<0:7>, and AY6H<0:3> using the above-mentioned address latch signal YAEDI, and outputs the latched result, such that it does not encounter a conventional timing margin problem.

Figure 9:
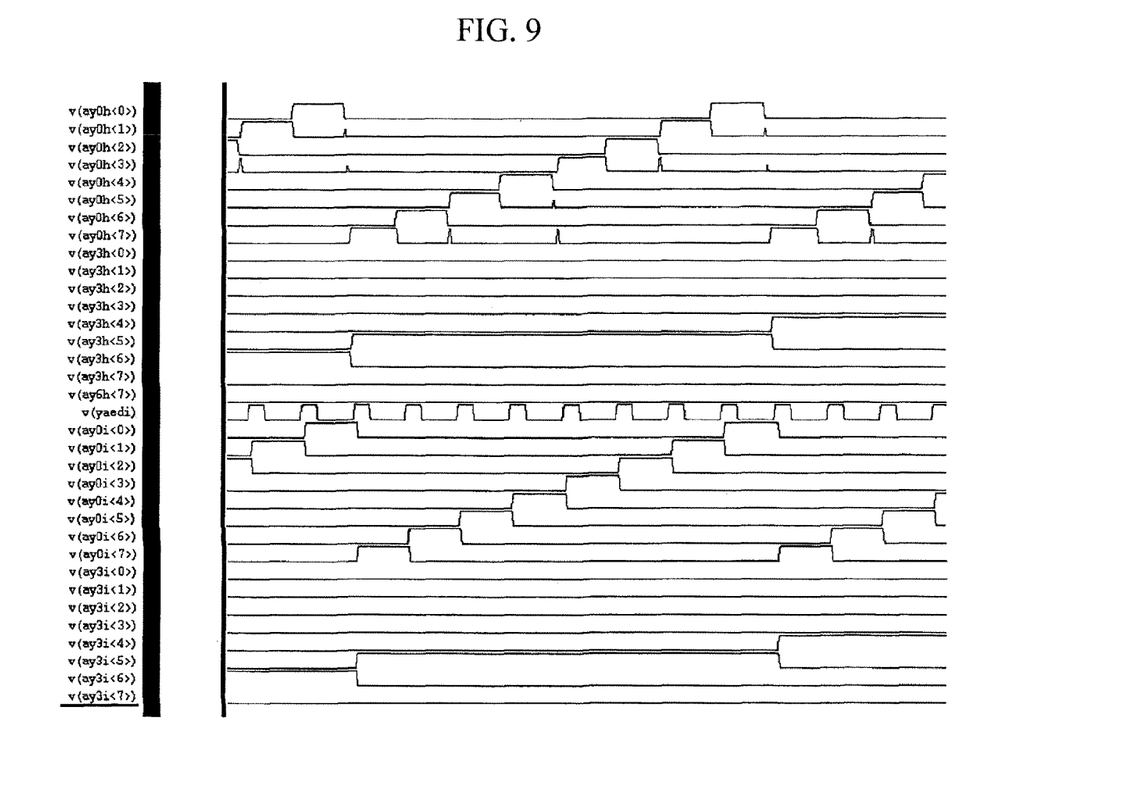
FIG. 9 is a waveform diagram illustrating internal column address signals latched by an address latch signal according to one or more of the herein described embodiments.

FIG. 9 is a waveform diagram illustrating internal column address signals latched by an address latch signal. Referring to FIG. 9, if a glitch occurs in the signal AYxH<0:n>, the YAEDI signal is enabled after the lapse of a predetermined time sufficiently spaced apart from the glitch generation time, such that the glitch is removed from the signal AYxH<0:n>.

As described above, the address latch signal generation circuit and the address decoding circuit may use an address latch signal having a predetermined time margin associated with a level-transition time point of the pre-decoded internal column address signal, prevent a skew or glitch from being generated by an insufficient timing margin between a level-transition period of the internal column address signal and an address latch signal, and prevent I/O-associated erroneous operations from being generated by the skew or glitch.

As apparent from the above description, structures and methods are described that determines whether an internal column address signal is level-transitioned when generating an address latch signal capable of latching a pre-decoded internal column address signal, generate an address latch signal having a predetermined timing margin associated with the level-transition time point, prevent a skew or glitch from being generated by an insufficient timing margin between a level-transition interval of the internal column address signal and an address latch signal, and prevent I/O-associated erroneous operations from being generated by the skew or glitch.

Although the various embodiments have been disclosed for illustrative purposes, those skilled in the art will appreciate that various modifications, additions and substitutions are possible, without departing from the scope and spirit of the invention set forth in the accompanying claims.

What is claimed as new and desired to be protected by Letters Patent of the United States is:

1. An address latch signal generation circuit for generating an address latch signal capable of latching pre-decoded internal address signals, comprising:
   a plurality of address transition detectors, each of the address transition detectors receiving a plurality of internal address signals pre-decoded by a pre-decoder, detecting level transition states of the internal address signals, and generating a control signal having a predetermined enable period;
   a first logic unit for performing a logic operation on the control signals received from the plurality of address transition detectors, and generating a result signal; and
   a latch signal output unit for performing synchronization with a disable time point of the result signal from the first logic unit, thereby generating the address latch signal.

2. The address latch signal generation circuit according to claim 1, wherein each of the address transition detectors includes:
   a plurality of detection signal output units, each of which receives one of the internal address signals, detects a level transition state of the received internal address signal, and generates a transition detection signal having a predetermined enable period; and
   a second logic unit for performing a logic operation on the transition detection signals received from the detection signal output units, and generating a logic operation result.

3. The address latch signal generation circuit according to claim 2, wherein each of the detection signal output units includes:
   a first delay for delaying the received internal address signal by a predetermined time; and
   a third logic unit for performing a logic operation on the received internal address signal and the delayed result signal received from the first delay.

4. The address latch signal generation circuit according to claim 3, wherein the third logic unit performs an exclusive-OR operation.

5. The address latch signal generation circuit according to claim 4, wherein the third logic unit includes:
   a first inverter for inverting the output signal of the first delay;
   a fourth logic unit for performing a logic-AND operation between the received internal address signal and the output signal of the first inverter;
   a second inverter for inverting the received internal address signal;
   a fifth logic unit for performing a logic-AND operation between the output signal of the first delay and the output signal of the second inverter; and
   a sixth logic unit for performing a logic-OR operation on the output signals of the fourth and fifth logic units.

6. The address latch signal generation circuit according to claim 2, wherein the second logic unit performs a logic-OR operation on output signals of the detection signal output units.

7. The address latch signal generation circuit according to claim 1, wherein the first logic unit performs a logic-OR operation.

8. The address latch signal generation circuit according to claim 1, wherein the latch signal output unit includes:
   a second delay for delaying the output signal of the first logic unit by a predetermined time;
   a buffer for buffering the output signal of the second delay; and
   a seventh logic unit for performing a logic operation between the output signal of the first logic unit and the output signal of the buffer.

9. The address latch signal generation circuit according to claim 8, wherein the buffer is an inverter capable of performing an inversion-buffering operation.

10. The address latch signal generation circuit according to claim 8, wherein the seventh logic unit performs a NOR-operation.

11. The address latch signal generation circuit according to claim 1, wherein the internal address signal is a column address signal.

12. An address decoding circuit, comprising:
   an address latch signal generation circuit for generating an address latch signal capable of latching a plurality of internal address signals pre-decoded by a pre-decoder;
   an address latch unit for performing synchronization with the address latch signal, latching the pre-decoded internal address signals, and generating a latched result signal; and
   a final decoder for decoding the internal address signals latched by the address latch unit, and generating a column selection signal, wherein the address latch signal generation circuit includes:
   a plurality of address transition detectors, each of the address transition detectors receiving a plurality of internal address signals pre-decoded by the pre-decoder, detecting level transition states of the internal address signals, and generating a control signal which has a predetermined enable period;
   a first logic unit for performing a logic operation on the control signals received from the plurality of address transition detectors, and generating a result signal; and
   a latch signal output unit for performing synchronization with a disable time point of the result signal from the first logic unit, thereby generating the address latch signal.

13. The address decoding circuit according to claim 12, wherein each of the address transition detectors includes:
   a plurality of detection signal output units, each of which receives one of the internal address signals, detects a level transition state of the received internal address signal, and generates a transition detection signal having a predetermined enable period; and
   a second logic unit for performing a logic operation on the transition detection signals received from the detection signal output units, and generating a logic operation result.

14. The address decoding circuit according to claim 13, wherein each of the detection signal output units includes:
   a first delay for delaying the received internal address signal by a predetermined time; and
   a third logic unit for performing a logic operation on the received internal address signal and the delayed result signal received from the first delay.

15. The address decoding circuit according to claim 14, wherein the third logic unit performs an exclusive-OR operation.

16. The address decoding circuit according to claim 15, wherein the third logic unit includes:
   a first inverter for inverting the output signal of the first delay;
   a fourth logic unit for performing a logic-AND operation between the received internal address signal and the output signal of the first inverter;
   a second inverter for inverting the received internal address signal;
   a fifth logic unit for performing a logic-AND operation between the output signal of the first delay and the output signal of the second inverter; and
   a sixth logic unit for performing a logic-OR operation on the output signals of the fourth and fifth logic units.

17. The address decoding circuit according to claim 13, wherein the second logic unit performs a logic-OR operation on output signals of the detection signal output units.

18. The address decoding circuit according to claim 12, wherein the first logic unit performs a logic-OR operation.

19. The address decoding circuit according to claim 12, wherein the latch signal output unit includes:
   a second delay for delaying the output signal of the first logic unit by a predetermined time;
   a buffer for buffering the output signal of the second delay; and
   a seventh logic unit for performing a logic operation between the output signal of the first logic unit and the output signal of the buffer.

20. The address decoding circuit according to claim 19, wherein the buffer is an inverter capable of performing an inversion-buffering operation.

21. The address decoding circuit according to claim 19, wherein the seventh logic unit performs a NOR-operation.

22. The address decoding circuit according to claim 12, wherein the internal address signal is a column address signal.

* * * * *

UNITED STATES PATENT AND TRADEMARK OFFICE
CERTIFICATE OF CORRECTION

| | | |
|---|---|---|
| PATENT NO. | : 7,227,811 B2 | |
| APPLICATION NO. | : 11/164723 | |
| DATED | : June 5, 2007 | |
| INVENTOR(S) | : Yong D. Cho | |

It is certified that error appears in the above-identified patent and that said Letters Patent is hereby corrected as shown below:

On the Title Page:

At field (75), "Yong Cho" should be -- Yong Deok Cho --.

Signed and Sealed this

Twentieth Day of November, 2007

JON W. DUDAS
*Director of the United States Patent and Trademark Office*